(12) United States Patent
Mizuno (10) Patent No.: US 7,052,991 B2
(45) Date of Patent: May 30, 2006

(54) ELECTRODEPOSITION FILM FORMING METHOD, AND SEMICONDUCTOR APPARATUS

(75) Inventor: Masaki Mizuno, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/014,678

(22) Filed: Jun. 17, 2004

(65) Prior Publication Data

US 2005/0092612 A1    May 5, 2005

(30) Foreign Application Priority Data

Jun. 23, 2003 (JP) ............... 2003-178121
Mar. 25, 2004 (JP) ............... 2003-089542

(51) Int. Cl.
*H01L 21/44* (2006.01)
(52) U.S. Cl. .............. 438/674; 438/675; 438/676
(58) Field of Classification Search ........... 438/674, 438/675, 676, 677, 678, 687
See application file for complete search history.

(56) References Cited

U.S. PATENT DOCUMENTS 5,948,232 A * 9/1999 Murphy et al. ............ 205/122

| | | | |
|---|---|---|---|
| 6,334,965 B1 * | 1/2002 | Singh et al. ............... | 252/500 |
| 6,552,555 B1 * | 4/2003 | Nuytkens et al. ........... | 324/754 |
| 2002/0083858 A1 * | 7/2002 | MacDiarmid et al. ...... | 101/484 |

FOREIGN PATENT DOCUMENTS

JP        06-57496        3/1994

* cited by examiner

*Primary Examiner*—Caridad Everhart
(74) *Attorney, Agent, or Firm*—Fitzpatrick, Cella, Harper & Scinto

(57) ABSTRACT

An electrodeposition film forming method includes forming an electrodeposited film of an electrodeposition coating material having good thermal fluidity by a first electrodeposition; forming an electrodeposition film in a very small through-hole provided on a conductive or semiconductive substrate; removing electrodeposited film at an opening portion of the through-hole under a wet-coated condition; and hardening the electrodeposition film to obtain a flat portion other than the opening portion. Then, a second electrodeposition film of an electrodeposition coating material having good thermal fluidity is formed around the opening portion and is hardened to coat uncoated portions of the opening portion remaining after the first deposition. Accordingly, a flat inner surface of the through-hole is obtained, any exposed portions of an underlayer at the opening of the through-hole are covered and the opening of the through-hole is maintained.

8 Claims, 4 Drawing Sheets

ELECTRODEPOSITION FILM FORMING METHOD, AND SEMICONDUCTOR APPARATUS

BACKGROUND OF THE INVENTION

1. Field of the Invention

The present invention relates to a method of forming an insulating film an inner surface of a through-hole provided in a conductive substrate or a semiconductive substrate by using an electrodeposition coating. The present invention further relates to a semiconductor apparatus in which a conductive film is further formed on an inner surface of the thus-formed insulating film such that conduction can be established between its front surface and its rear surface.

2. Description of the Related Art

Electrodeposition coating techniques have been conventionally used for coating components having complicated shapes, such as parts of motor cars and electronic apparatuses or equipment. Generally, thicknesses of the electrodeposited films when hardened are in a range from 20 microns to 100 microns. During electrodeposition coating, the thickness of a wet-coated film is normally reduced by 80% to 90% when the film is hardened. At the time of hardening and shrinkage of the wet-coated film, thermal flow occurs from its thick portion toward its thin portion. Accordingly, a very flat coated film can be obtained.

In the event that an edge portion is present in the coated component, the thickness of a wet-coated film at the edge portion prior to hardening is likely to be thicker than that at a flat portion since current is concentrated at the edge portion. In the wet-coated film at the edge portion, thermal flow toward the flat portion occurs at the time of hardening. It is accordingly likely that an underlying substrate at the edge portion is exposed, and remains uncoated, since an excessive thermal flow occurs at the edge portion.

Therefore, it is known to use an electrodeposition coating material containing a fluidity adjusting agent to control the thermal flow. The fluidity adjusting agent is a material for controlling the thermal flow. An electrodeposition coating material can be obtained by adding a filler with its main component silicon, silica and a polymer, such as fatty acid amide wax, in the electrodeposition coating material in amounts from about 1% to about 30%. However, when electrodeposition coating is carried out using a fluidity adjusting agent, thermal flow of the electrodeposition film becomes difficult to occur at the more interior, flat portion due to the polymer of the fluidity adjusting agent. The edge portion, however, is appropriately covered with a film having a certain thickness at the time of hardening. Accordingly, since unwanted stress is applied to the more interior, flat portion, it is likely that the surface of the coated film undulates and the flat portion is less uniformly flat.

Japanese Patent Application Laid-Open No. 6(1994)-57496 discloses a two-step electrodeposition of a two-coat and two-bake type. In the two-step electrodeposition, an electrodeposition coating material with a good thermal fluidity is coated onto a surface by a first electrodeposition coating, and hardened. The flatness of a flat portion other than an edge portion is acquired by the first electrodeposition coating. At the edge portion, the surface is exposed, and it remains uncoated. In a second electrodeposition coating, an electrodeposition coating material containing a fluidity adjusting agent for controlling thermal fluidity is then coated, and hardened. Since the second electrodeposition coating is selectively conducted only on a surface of a conductive material, the coating can be selectively carried out on the edge portion that is not yet coated during the first electrodeposition coating. Thus, the two-step electrodeposition of the two-coat and two-bake type can achieve an electrodeposition coating in which the entire surface of the edge portion and the flat portion is fully covered, while the flatness of the flat portion is secured.

In recent years, electrodeposition techniques are used not only for coating on external cover components, such as components for motor cars and electronic apparatuses, but also for formation of an insulating film that is necessary when a conductive pattern is formed on a conductive substrate or a semiconductor substrate. Particularly, in the event that a through-hole provided in the conductive or semiconductive substrate is used to establish conduction between its front surface and its rear surface, an insulating film is initially formed on an inner-side surface of the through-hole, and a conductive film is further formed on an inner surface of the insulating film. The electrodeposition technique can be employed for the formation of the insulating film.

The inner diameter of the through-hole decreases to a very small magnitude, for example, to a range from 50 microns to 150 microns, as the density of the conductive pattern increases. It is accordingly required for the insulating film formed on the inner surface of the through-hole that its thickness be in a range between about 2 microns and about 20 microns, and that it has excellent flatness. The reason for this is as follows. Electrical leakage to the insulated conductive material occurs if the flatness is not uniform and undulations form and the thickness of the insulating film decreases to about less than 2 microns. Therefore, its insulation properties become poor, and the function of the insulating film is likely to be nullified. Further, if the thickness of the insulating film at the time of hardening increases to about more than 20 microns, it becomes very difficult to form the conductive film on the inner surface of the insulating film.

The thickness of the insulating pattern used in the conductive or semiconductor substrate is normally in a range between 2 microns and 20 microns, and this range of the required thickness is significantly different from a range of the thickness of the coated film used in the conventional components of motor cars, electronic apparatuses or the like. Hence, it is quite difficult to form an insulating film having a thickness from 2 microns to 20 microns on the inner surface of a though-hole whose inner diameter is in a range between 50 microns and 150 microns.

In the event that a coated film is formed by a single electrodeposition of an ordinary electrodeposition coating material without any fluidity adjusting agent, an underlayer at the edge portion in close proximity to an opening portion of the through-hole is liable to be exposed since an excessive thermal flow occurs at the edge portion as discussed above.

Where a coated film is formed by a single electrodeposition of an electrodeposition coating material containing the above-discussed fluidity adjusting agent, formation of a wet-coated film having a thickness of 60 microns is needed for formation of an electrodeposition film having a thickness of 20 microns. If the wet-coated film having a thickness of 60 microns is formed on the inner surface of the through-hole, a wet-coated film with a thickness of 80 microns is likely to be formed at the opening portion of the through-hole. The opening portion is therefore enclosed by the film, and there is a great possibility that the closure of the through-hole occurs. If closure at the opening portion of the through-hole occurs, degradation of conduction appears since it becomes impossible for the conductive film formed on the inner surface of the insulating film to establish conduction between the front surface and the rear surface of the through-hole.

Further, the coated film is likely to undulate and lose flatness since unwanted stress is applied to the flat portion at the time of hardening of the wet-coated film, as discussed above. If the surface of the insulating film becomes more irregular and the film thickness is decreased to about less than 2 microns, electrical leakage to the insulated conductive material occurs and its insulation is degraded.

Also, in the case of the formation of the coated film by the two-step electrodeposition of the two-coat and two-bake type disclosed in the above-discussed Japanese Patent Application Laid-Open No. 6(1994)-57496, there is a great possibility that the opening portion is choked and closure of the through-hole occurs, similar to the case of the formation of the coated film by a single electrodeposition of the electrodeposition coating material containing the fluidity adjusting agent.

Furthermore, in the case of the two-step electrodeposition, the through-hole is very likely to be choked with the first coated film. The reason for this is as follows. Since the first wet-coated film contains no fluidity adjusting agent, thermal flow of the material occurs due to its surface tension at the time of hardening, and the material is caused to flow from a thick portion of the wet-coated film at the opening portion into a thin portion of the wet-coated film on the inner surface of the through-hole. Accordingly, in the event that the inner diameter of the through-hole is very small; for example, about 50 microns to 150 microns, closure is created in the through-hole. If closures are created in the through-hole and at the opening portion of the through-hole, degradation of the conduction occurs since it becomes impossible for the conductive film formed on the inner surface of the insulating film to establish conduction between the front surface and the rear surface of the through-hole.

SUMMARY OF THE INVENTION

It is an object of the present invention to prevent closure of a through-hole and to secure flatness of an inner surface of a through-hole in the event that an electrodeposition film is formed in a very small through-hole provided in a conductive or semiconductive substrate. Exposure of an underlayer at an opening portion of the through-hole is likely to normally occur subsequent to hardening of the electrodeposition film, which causes, in turn, closure of the through-hole and reduction in flatness of an inner surface of the through-hole.

According to one aspect of the present invention, there is provided an electrodeposition film forming method which includes (a) a step of coating a first electrodeposition film on the inner surface of a through-hole provided in a conductive or semiconductive substrate; (b) a step of removing a predetermined amount of the first electrodeposition film formed in close proximity to an opening portion of the through-hole, prior to hardening the first electrodeposition film; (c) a step of hardening the first electrodeposition film after conducting the step (b) of removing the predetermined amount of the first electrodeposition film; (d) a step of coating a second electrodeposition film on a surface in close proximity to the opening portion of the through-hole; and (e) a step of hardening the second electrodeposition film.

According to another aspect of the present invention, there is provided a semiconductor apparatus in which an insulating film is formed on an inner surface of a through-hole provided in a semiconductive substrate, and a conductive film is formed on an inner surface of the insulating film such that conduction is established between a front surface and a rear surface of the semiconductive substrate, and in which the insulating film is composed of (i) a first electrodeposition film formed by hardening after removing a predetermined amount of the first electrodeposition film coated on the surface in close proximity to an opening portion of the through-hole prior to said hardening, and (ii) a second electrodeposition film coated on a surface in close proximity to the opening portion of the through-hole and thereafter hardened.

The above and other objects, features, and advantages of the invention will become more apparent from the following detailed description taken in conjunction with the accompanying drawings.

DESCRIPTION OF THE PREFERRED EMBODIMENTS

Figure 1A:
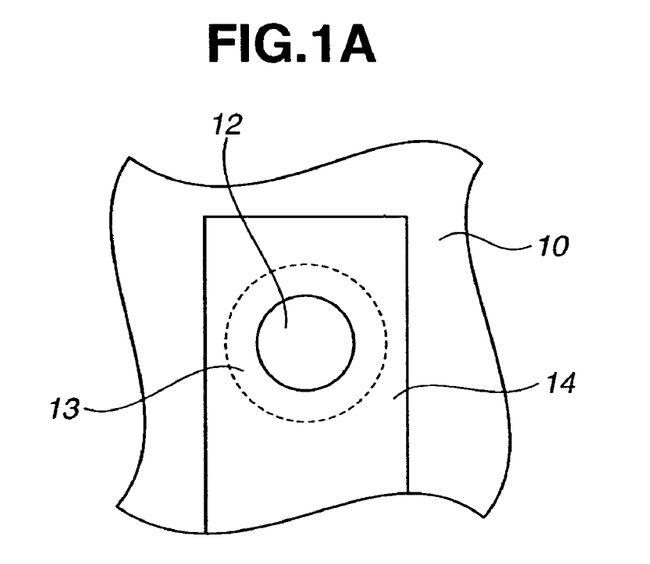
FIG. 1A is a plan view illustrating a conductor apparatus or a semiconductor apparatus according to the present invention.
Figure 1B:
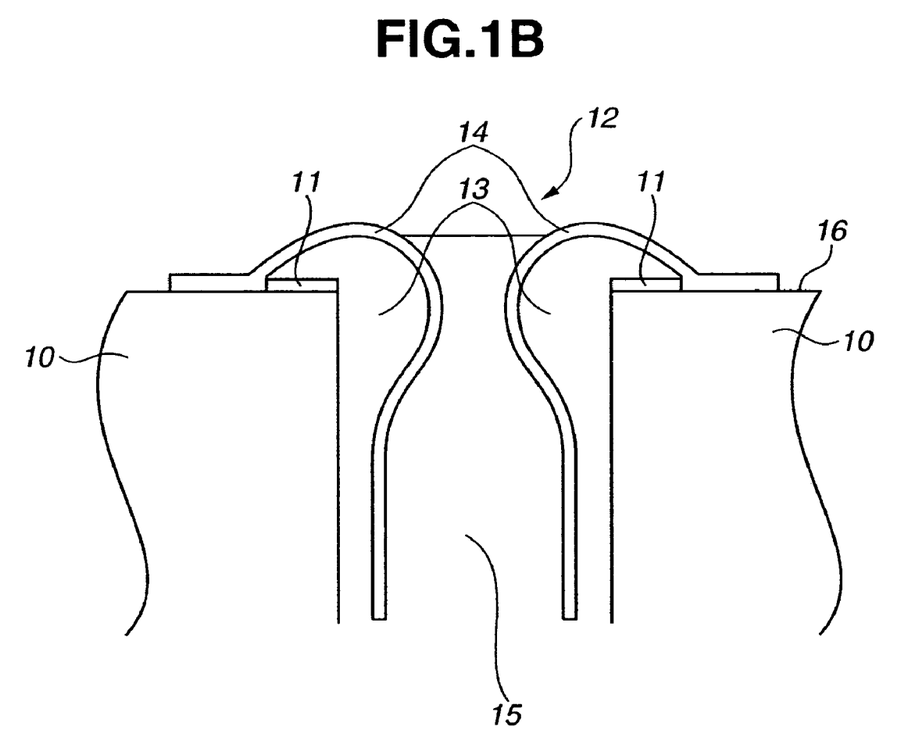
FIG. 1B is a cross-sectional view illustrating the conductor apparatus or the semiconductor apparatus according to the present invention.

FIGS. 1A and 1B conceptually illustrate a conductor or semiconductor apparatus in which a through-hole is formed in a conductive or semiconductive substrate 10 such that conduction can be established between a front surface 16 and a rear surface (not shown) of the substrate 10. FIG. 1A is an enlarged plan view illustrating only a portion near an opening portion of a through-hole 12 formed in the substrate 10. FIG. 1B is an enlarged cross-sectional view illustrating only the portion near the opening portion of the through-hole 12 formed in the substrate 10.

In FIGS. 1A and 1B, reference numeral 10 designates the conductive or semiconductive substrate. Reference numeral 11 designates an insulating film formed on the front and rear surfaces of the substrate 10. Reference numeral 12 designates the through-hole penetrating the substrate 10. Reference numeral 13 designates an insulating electrodeposition film formed on an inner surface of the through-hole 12 and at a place around the opening portion of the through-hole 12. The thickness of the insulating electrodeposition film 13 around the opening portion is set larger than that of the insulating electrodeposition film 13 on the inner surface of the through-hole 12. Reference numeral 14 designates a conductive film formed on an outer surface of the insulating electrodeposition film 13 formed in the through-hole 12 and around the opening portion of the through-hole 12. The conductive film 14 is connected to an electrode pad (not shown) which has been previously formed on the surface of the substrate 10. The insulating electrodeposition film 13 is formed such that the conductive film 14 can be thoroughly insulated from the substrate 10.

FIGS. 2A to 2H are cross-sectional views illustrating steps of fabricating the substrate of this embodiment. In the fabrication steps, an insulating film is formed by the electrodeposition coating in a through-hole 12 provided in a conductive or semiconductive substrate. In FIGS. 2A to 2H, like reference numerals designate the same or similar portions illustrated in FIGS. 1A and 1B.

Figure 2A:
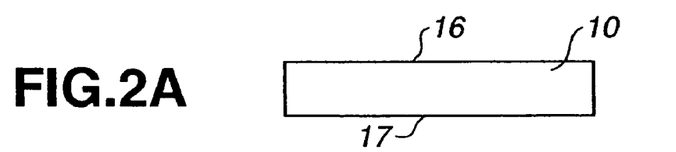
FIGS. 2A through 2H are cross-sectional views illustrating fabrication steps of the conductor apparatus or the semiconductor apparatus according to the present invention, respectively.

Initially, a conductive substrate of aluminum or the like, or a semiconductive substrate of silicon or the like is prepared as illustrated in FIG. 2A.

Figure 2B:
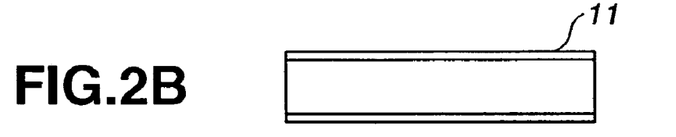

Then, as illustrated in FIG. 2B, an insulating film 11 having a thickness in a range from 1.5 microns to 3.0 microns is formed on front 16 and rear 17 surfaces of the substrate 10 by using coating means such as spin coat. The material of the insulating film 11 can be polyimide, polyether amide, or the like.

Figure 2C:
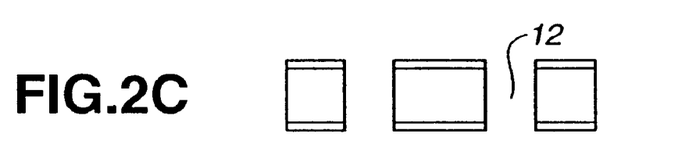

Then, as illustrated in FIG. 2C, a through-hole 12 with a diameter in a range from 50 microns to 150 microns is formed in the substrate 10. The through-hole can be formed by laser machining, drill machining, an etching method, or the like. The forming method can be appropriately selected considering the material of the substrate 10, the shape and aspect ratio of the through-hole 12, productivity, and so forth.

Figure 2D:
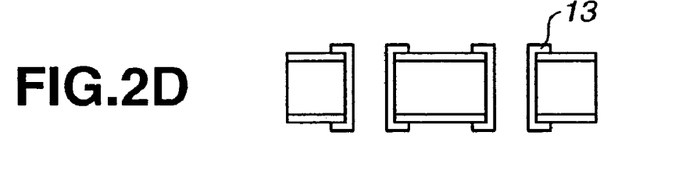

Then, as illustrated in FIG. 2D, an electrodeposition film 13 is formed on the substrate 10. The electrodeposition film 13 is composed of a first electrodeposition coating material (A) without any fluidity adjusting agent, and a second electrodeposition coating material (B) containing a fluidity adjusting agent.

Figure 3:
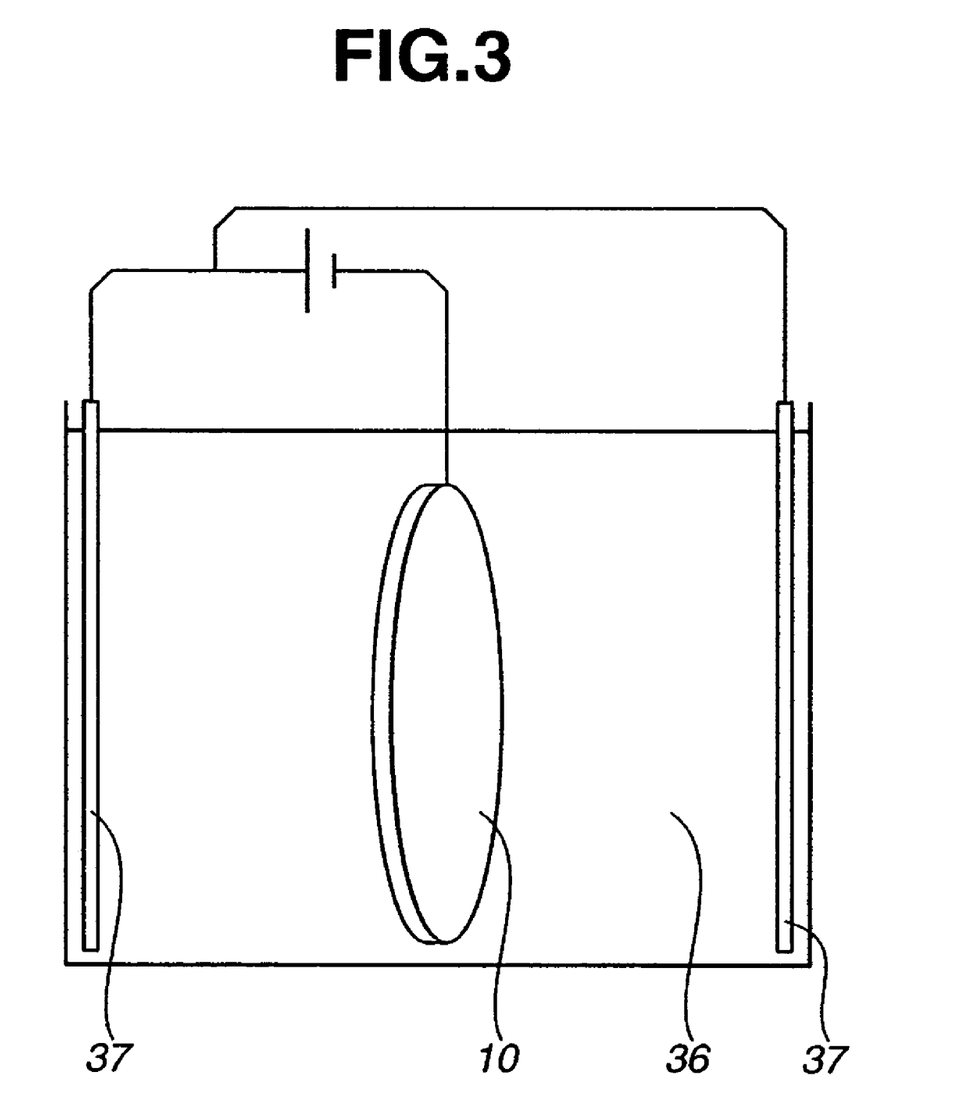
FIG. 3 is a view schematically illustrating an electodepositing apparatus for fabricating the conductor apparatus or the semiconductor apparatus according to the present invention.

FIG. 3 schematically illustrates an electrodepositing apparatus. In FIG. 3, reference numeral 36 designates an electrodeposition coating material for forming the electrodeposition film on the substrate 10. The substrate 10 is mounted in the electrodeposition coating material 36 by interposing the substrate 10 between two electrodes 37. The electrodeposition coating is carried out by making electrodes 37 a positive electrode and making substrate 10 a negative electrode. Further, magnitudes of applied voltage and electrode size and spacing are adjusted such that the electrodeposition film cannot be brought into contact with an edge portion facing the electrodeposition film. A film structure of the present invention can be thus formed by such a two-step electrodeposition.

Figure 4A:
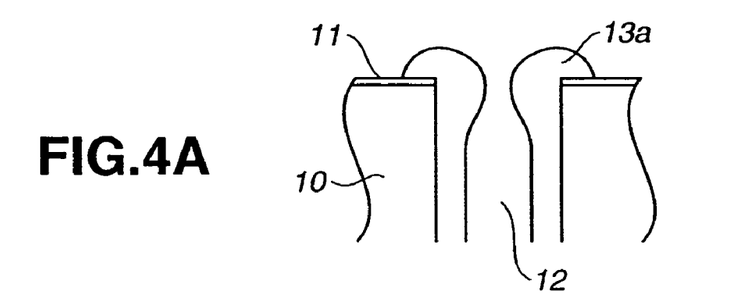
FIGS. 4A through 4E are cross-sectional views illustrating an electrodepositing method for fabricating the conductor apparatus or the semiconductor apparatus according to the present invention.

A method of forming the electrodeposition film 13 using the electrodepositing apparatus of FIG. 3 will be described in detail with reference to FIGS. 4A to 4E. In FIGS. 4A to 4E, like reference numerals designate the same or similar portions illustrated in FIGS. 1A and 1B. Initially, a first electrodeposition film 13a is formed by using the first electrodeposition coating material (A), as illustrated in FIG. 4A. The first electrodeposition coating material (A) can be an insulating material, such as polyimide, maleimide, or the like.

With respect to the thickness of the electrodeposition film 13a, the thickness of the electrodeposition film 13a formed on the inner surface of the through-hole 12 is approximately uniform, while the thickness of the electrodeposition film 13a formed around the opening portion of the through-hole 12 is formed larger than that of the electrodeposition film 13a on the flat portion since current is concentrated at the edge portion at the time of electrodeposition. Here, the electrodeposition film 13a (a wet-coated film) formed around the opening portion may close-off the opening insofar as the thickness of the electrodeposition film 13a formed on the inner surface of the through-hole 12 is approximately uniform. Therefore, the electrodeposition film 13a can be formed without paying attention to the danger of closing the opening portion.

Figure 4B:
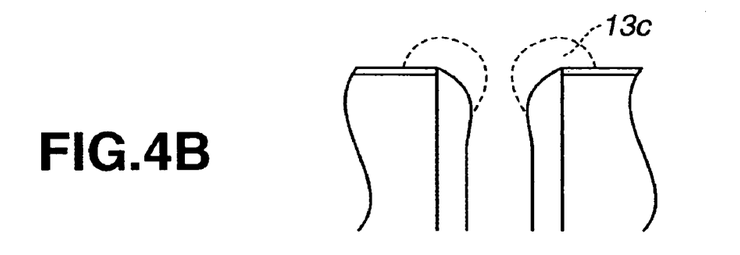

Then, as illustrated in FIG. 4B, ultrasonic cleaning is performed to scrape off the excess portion 13c of the electrodeposition film 13a present in close proximity to the opening of through-hole 12. It is possible to selectively scrape the excess portion 13c of the first electrodeposition film 13a present in close proximity to the opening portion by ultrasonic cleaning to leave only the electrodeposition film 13a on the inner surface of the through-hole 12. Since only the excess portion 13c of electrodeposition film 13a in the vicinity of the opening portion of the through-hole 12 is scraped by the ultrasonic cleaning, the desired diameter of the through-hole can be regained even if a portion near the opening diameter of the through-hole 12 is narrowed with excess deposit 13c of electrodeposition film 13a.

Figure 4C:
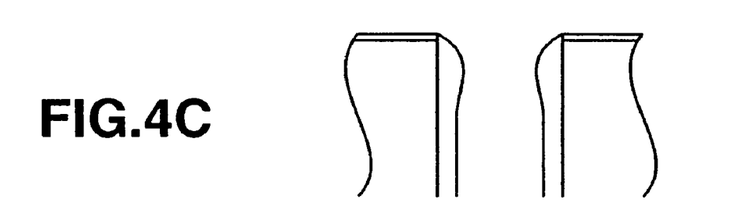

The electrodeposition film 13 is then hardened as illustrated in FIG. 4C. At the time of hardening, a large thermal flow of the electrodeposition film 13 does not occur because a thick portion 13c of the electrodeposition film 13 around the opening portion of the through-hole 12 has been scraped in the above-discussed step illustrated in FIG. 4B. Accordingly, a large amount of the electrodeposition film 13a (the wet-coated film) does not flow back into the through-hole 12 due to the thermal flow, and, hence, no closure appears in the through-hole 12. However, since thermal flow of the wet-coated film occurs somewhat at the opening portion, the film can subside into the through-hole and the underlaid substrate 10 can be exposed around the opening portion.

Figure 4D:
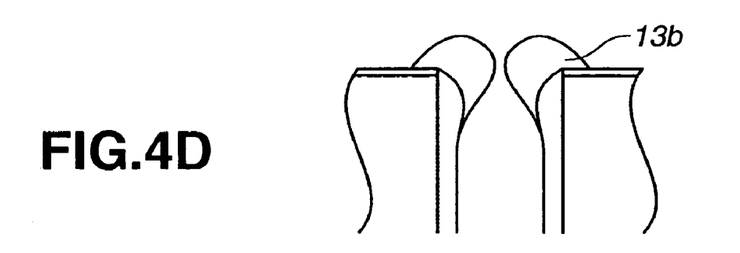

To remedy this problem, as illustrated in FIG. 4D, a second electrodeposition film 13b is formed employing a second electrodeposition coating material (B). The second electrodeposition coating material (B) is an electrodeposition coating material which contains a fluidity adjusting agent which controls its thermal fluidity. The coating material (B) can be polyimide, maleimide, or the like.

The fluidity adjusting agent is, for example, a material having as its main component silicon, silica, or fatty acid amide wax. The electrodeposition film 13b is formed only on a portion sufficient to cover any exposed portion of the substrate 10 at the opening portion. The electrodeposition film 13b is not formed on the other portions that are insulated by the electrodeposition film 13a. When the electrodeposition film 13b is formed, attention must be paid to prevent the opening portion from becoming closed in contrast to the electrodeposition of the first electrodeposition film 13a.

Figure 4E:
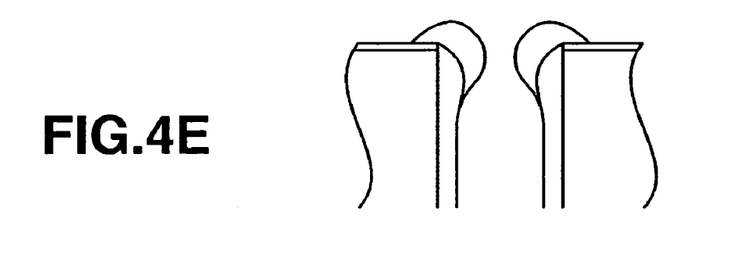

Thereafter, the second electrodeposition film 13b is hardened as illustrated in FIG. 4E. No thermal flow of the electrodeposition film 13b due to the hardening occurs and the electrodeposition film 13b around the opening portion is shrunk in place, without subsiding, since the electrodeposition film 13b contains the fluidity adjusting agent. The size of the remaining opening portion is sufficient due to film shrinkage on hardening such that the following conductive film can be formed. In the above-discussed steps, it is possible to form the electrodeposition film without any closure of the through-hole and with a flatly-finished inner portion of the through-hole 12.

Figure 2E:
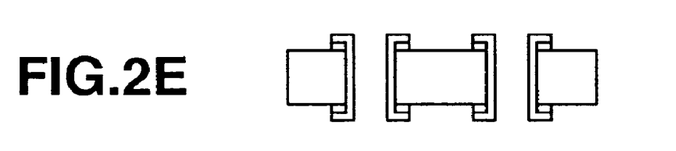

Then, as illustrated in FIG. 2E, an insulating film 11 formed on the front and rear surfaces of the substrate 10 is removed. For example, the insulating film 11 is removed by ashing the front and rear surfaces of the substrate 10 using oxygen plasma with portions covered with the electrodeposition film being left.

Figure 2F:
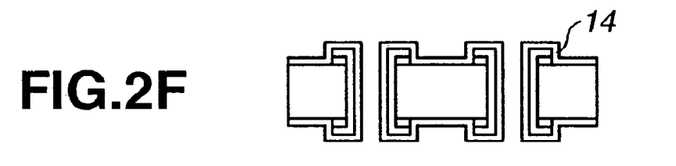

Then, as illustrated in FIG. 2F, a conductive film 14 is formed on an exposed surface of the electrodeposition film 13 and the front and rear surfaces of the substrate 10. Copper, nickel, palladium, gold, or silver can be used as a material of the conductive film. As a conductive film fabrication method, a dry plating, a wet plating, or a jet printing method can be used. The material and the fabrication method can be appropriately selected in accordance with the shape and aspect ratio of the through-hole 12.

Figure 2G:
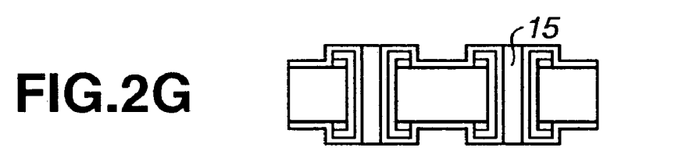

Then, as illustrated in FIG. 2G, a hole surrounded by the conductive film 14 formed on the inner surface of the through-hole 12 is filled with a filling material 15. As the filling material, a conductive metal material, such as copper and silver, or an insulating resin material, such as polyimide, silicone, amide and epoxy resin, can be used, for example. As the filling method, dipping, dispense, printing, electrodeposition or the like can be used. The filling material 15 is not necessarily used, and no material can be filled in the through-hole 12.

Figure 2H:
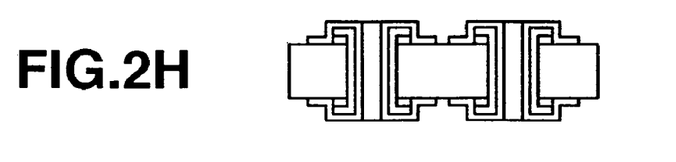

Then, as illustrated in FIG. 2H, the conductive film 14 on the front and rear surfaces of the substrate 10 is patterned. The conductive film 14 is thereby electrically connected to the electrode (not shown) which is previously provided on the substrate 10. This patterning step can be executed prior to the filling step illustrated in FIG. 2G.

It is possible by the above-discussed steps to readily achieve a semiconductor apparatus which is capable of a highly dense arrangement provided with a structure of the through-hole 12 for connecting the front and rear surfaces of the substrate 10 including the electrodeposition film 13, the conductive film 14, and the filling material 15.

A First Embodiment of the present invention will be described. In the First Embodiment, a substrate 10 of silicon having a thickness of 625 microns is prepared in a step corresponding to the step of FIG. 2A. Electrode, semiconductor device, and wiring are initially provided on the surface of the substrate 10, and the substrate 10, other than a portion of the electrode, is covered with an insulating film of $SiO_2$ and SiN.

Polyether amide is coated on the front and rear surfaces of the substrate 10 using a spin coater in a step corresponding to the step of FIG. 2B. The polyether amide is coated on each of the front and rear surfaces of the substrate 10 at a thickness of 1.5 microns, and is then hardened at a temperature of 250° C. for 60 minutes.

A through-hole 12 is formed using a laser in a step corresponding to the step of FIG. 2C. An Nd:YAG laser second harmonic generation (laser wavelength is 532 nm) is used as the laser, and a hole with a diameter of 80 microns is formed using Q-switch pulse oscillation, pulse width of 30 nsec, and an oscillation frequency of 3 kHz. In this instance, fluence and shot number on the working surface are set to 65 J/cm$^2$ and 100 shots, respectively. After a laser beam emitted from the laser oscillator is expanded to a beam with a diameter of 500 microns by a combination of optical lenses, a peripheral portion of the beam is removed by passage of the beam through a mask with a diameter of 400 microns, and a circular beam is thereby obtained. The beam is then concentrated by an optical system with a reducing magnification such that its diameter on the substrate can be decreased to 20% of 400 microns (i.e., 80 microns). The intensity of the laser beam is thus increased to a fluence of 65 J/cm$^2$. Upon irradiation of the substrate with the laser beam obtained by the above function, laser machining is immediately started. The through-hole can be thus formed in the substrate 10 by the oscillation pulses of 100 shots of the laser beam.

Then, in a step corresponding to the step of FIG. 2D, an electrodeposition film 13 is formed on an inner surface of the through-hole 12 and at a place near an opening portion of the through-hole 12 by an electrodepositing method.

As a first electrodeposition coating material (A), a cationic polyimide electrodeposition coating material (Elecoat produced by Shimizu Inc.) is used. The substrate is mounted to be interposed between two electrodes as illustrated in FIG. 3. The electrodeposition coating process is carried out by setting the electrodes 37 as a positive electrode and setting the substrate 10 as a negative electrode. An electrodeposition film with a thickness of about 25 microns is deposited at 25° C. for 120 seconds under an electric-field condition of 150 V.

The substrate is thereafter lifted from the electrodeposition coating material, and is subjected to ultrasonic cleaning under a wet condition. The substrate is put in a round-bottomed flask filled with pure water, and the cleaning is carried out by ultrasonic waves of 38 kHz until liquid flow through all the through-holes in the substrate can be confirmed. Since vibration of the water is considerably weaker in the through-hole as compared to vibration intensity on the surface of the substrate, electrodeposition coated film in the through-hole remains. After only the electrodeposited film at the edge portion and the liquid plugging the through-hole are removed, the electrodeposited film is hardened at 250° C. for 60 minutes. The thickness of the electrodeposition film is reduced to 5 microns due to the hardening.

As a second electrode position coating material (B), a cationic polyimide electrodeposition coating material (Elecoat produced by Shimizu Inc., containing a fluidity adjusting agent at 25 wt. %) is used. The electrodeposition film is deposited at 25° C. for 120 seconds under an electric-field condition of 150 V, using an apparatus similar to the apparatus used in the first electrodeposition. The electrodeposition film is hardened at 250° C. for 60 minutes. The electrodeposited film with a thickness of 5 microns can be thereby obtained while coverage of the edge portion and flatness of the inner surface of the through-hole are both established.

Then, in a step corresponding to the step of FIG. 2E, the insulating film 11 formed in the step of FIG. 2B is removed. The insulating film 11 is removed by ashing the front and rear surfaces of the substrate 10 using oxygen plasma with portions covered with the electrodeposition film 13 remaining. The ashing is executed employing an oxygen plasma of 200 sccm at a pressure of 0.08 torr for 20 minutes.

Then, in a step corresponding to the step of FIG. 2F, a conductive film 14 is formed on the inner surface of the electrodeposition film 13 and the front and rear surfaces of the substrate 10, using electroless plating. The plating is performed by formation of a superficial film with a thickness of 0.5 micron by plating with potassium hydroxide at 75° C. for 5 minutes, using a pre-treatment liquid (MELPLATE ITO conditioner 480, MELPLATE conditioner 1101, and ENPLATE activator 440 produced by Meltex Inc.), and using a Ni plating liquid (MELPLATE NI-867 produced by Meltex Inc.), and annealing is thereafter conducted for 30 minutes.

Then, in a step corresponding to the step of FIG. 2G, a hole surrounded by the conductive film 14 formed on the inner surface of the through-hole 12 is filled with a filling material 15 by a printing method. In the printing method, a metal mask is used, and a polyimide ink (FS-510T40S produced by Ube Kosan K. K.) is filled employing an attack angle of 25° C. of a squeegee, a squeegee speed of 30 mm/sec, a clearance of 1.5 mm, and a printing pressure of 0.25 Mpa. After the printing, three drying processes, at 110° C. for 5 minutes each, are repeated, and a hardening process is performed at 250° C. for 60 minutes.

Then, in a step corresponding to the step of FIG. 2H, the conductive film 14 on the front and rear surfaces of the substrate 10 is patterned. The patterning method is as follows. Initially, a positive photosensitive resist (OFPR800 produced by Tokyo Ohka Kogyo K. K.) having a thickness of 2 microns is uniformly coated by a spin coater. Thereafter, the resist is dried at 110° C. for 90 minutes. After exposure to light is executed by an aligner using a mask corresponding to the patterning, development is then performed using a developing liquid (NMD-W produced by Tokyo Ohka Kogyo K. K.). Etching is then conducted by dipping the substrate in an etching liquid of phosphoric acid (10%), nitric acid (40%) and acetic acid (40%) for 15 minutes. Finally, any remaining resist is removed by dipping the substrate in a resist remover liquid (REMOVER LIQUID 104 produced by Tokyo Ohka Kogyo K. K.) for 2 minutes, and a predetermined patterning is thus achieved. Thereby, the electrode provided on the substrate is selectively connected to the conductive film 14.

Conductivity of the thus-formed electrodeposition film 13 was evaluated by measuring a resistance value of the conductive pattern on the front and rear surfaces of the substrate 10 using MULTIMETER (34401A by HEWLETT PACKARD). Further, insulation was judged by measuring a value of current between the conductive pattern on the substrate 10 and the silicon substrate using HIGH RESISTANCE METER 4339B by HEWLETT PACKARD. Measurement results for the inventive first embodiment are shown in Table 1. For comparison, there are also shown values of unsatisfactory (or failed) conduction and unsatisfactory (or failed) insulation from Comparative Example 1 which is a one-step electrodeposition where an electrodeposition coating material containing the fluidity adjusting agent for controlling thermal fluidity is used, and values from Comparative Example 2 of the two-step electrodeposition disclosed in the above-referenced Japanese Patent Application Laid-Open No. 6(1994)-57496.

TABLE 1

|  | Failed conduction | Failed insulation |
|---|---|---|
| Comparative example 1 | 30/100 | 25/100 |
| Comparative example 2 | 33/100 | 2/100 |
| First embodiment | 0/100 | 0/100 |

As can be understood from Table 1, yields of unsatisfactory conduction and unsatisfactory insulation are drastically reduced when employing the two-step electrodeposition of the first embodiment. In Comparative Example 1, 30% of the products showed failed conduction and 25% had failed insulation. Thus, failed conduction and insulation appeared in Comparative Example 1. In Comparative Example 1, failed conduction occurs due to the choking of the opening portion of the through-hole by the insulating film. Failed insulation occurs due to undulations in the film caused by the stress at the time when the insulating film formed in the through-hole is hardened.

Further, failed conduction appeared in Comparative Example 2 because of choking in the through-hole by the insulating film which is subjected to thermal flow at the time of hardening.

A Second Embodiment of the present invention will be described. In the Second Embodiment, a through-hole 12 is formed in a substrate 10, an insulating film is formed in the through-hole, and a conductive film is formed on an inner surface of the insulating film, using a method similar to that used in the First Embodiment. Conduction is thus established between a front surface and a rear surface of the substrate 10. The Second Embodiment is different from the First Embodiment in that a diameter of the through-hole 12 formed by the laser is 150 microns, and the thickness of the insulating film formed by the electrodeposition is 60 microns when wet, and 20 microns after hardening.

Similarly to the First Embodiment, conductivity and insulation of the electrodeposition film 13 were measured. Measurement results are shown in Table 2. For comparison, there are also shown numerals of unsatisfactory or failed conduction and insulation in a case (Comparative Example 1) of a one-step electrodeposition where an electrodeposition coating material containing the fluidity adjusting agent for controlling the thermal fluidity is used, and a case (Comparative Example 2) of a two-step electrodeposition disclosed in the above-referenced Japanese Patent Application Laid-Open No. 6(1994)-57496.

TABLE 2

|  | Failed conduction | Failed insulation |
|---|---|---|
| Comparative example 1 | 32/100 | 18/100 |
| Comparative example 2 | 40/100 | 0/100 |
| Second embodiment | 0/100 | 0/100 |

As can be understood from Table 2, values of conduction and insulation are also preferable in the two-step electrodeposition of the Second Embodiment. In contrast, unsatisfactory or failed conduction and insulation appeared in Comparative Example 1. The reason for this is that the undesired conduction occurs due to choking of the opening portion of the through-hole with the insulating film, and the undesired insulation occurs due to a poor flatness or undulations caused by stress at the time when the insulating film formed in the through-hole is hardened. Further, unsatisfactory conduction appeared in Comparative Example 2. The reason for this is due to the choking of the through-hole with the insulating film which is subjected to the thermal flow at the time of hardening.

A Third Embodiment of the present invention will be described. In the Third Embodiment, a through-hole 12 is formed in a substrate 10, an insulating film is formed in the through-hole, and a conductive film is formed on an inner surface of the insulating film, using a method similar to that used in the First Embodiment. Conduction is thus established between a front surface and a rear surface of the substrate 10. The Third Embodiment is different from the First Embodiment in that a diameter of the through-hole 12 formed by the laser is 50 microns, and the thickness of the insulating film formed by the electrodeposition is 10 microns when wet, and 2 microns after hardening.

Similarly to the First Embodiment, conductivity and insulation of the electrodeposition film 13 were measured. Measurement results are shown in Table 3. For comparison, there are also shown values of conduction and insulation for Comparative Example 1 which is a one-step electrodeposition where an electrodeposition coating material containing the fluidity adjusting agent for controlling the thermal fluidity is used, and a case (Comparative Example 2) of a two-step electrodeposition disclosed in the above-referenced Japanese Patent Application Laid-Open No. 6(1994)-57496.

TABLE 3

|  | Failed conduction | Failed insulation |
| --- | --- | --- |
| Comparative example 1 | 27/100 | 38/100 |
| Comparative example 2 | 35/100 | 3/100 |
| Third embodiment | 0/100 | 0/100 |

As can be understood from Table 3, yields of failed conduction and insulation are also drastically reduced to 0% in the two-step electrodeposition of the Third Embodiment. In contrast thereto, failed conduction and insulation appeared in Comparative Example 1 at 27% and 38%, respectively. The reason for this is that the failed conduction occurs due to choking of the opening portion of the through-hole with the insulating film, and the failed insulation occurs due to a poor flatness (undulations) caused by stress at the time when the insulating film formed in the through-hole is hardened. Further, failed conduction appeared in Comparative Example 2. The reason for this is due to the choking of the through-hole with the insulating film subjected to thermal flow at the time of hardening.

According to the present invention, it is possible to form a uniform electrodeposition film even on an inner surface of a very small through-hole provided in a conductive or semiconductive substrate. Further, it is possible to prevent an uncoated condition of an opening portion of the through-hole, under which an underlying substrate is exposed due to the thermal flow-at the time of hardening, and to accurately and uniformly form an electrodeposition film even subsequent to the hardening. Therefore, in the event that the electrodeposition film is an insulating film, the desired insulation effect can be accurately and certainly achieved. Furthermore, any projections of the electrodeposition film at the opening portion of the through-hole prior to hardening can be decreased to below a predetermined magnitude. Therefore, closure of the through-hole can be prevented, and it is hence possible to form a highly reliable electrodeposition film.

While the present invention has been described with respect to what is presently considered to be the preferred embodiments, it is to be understood that the invention is not limited to the disclosed embodiments. The present invention is intended to cover various modifications and equivalent arrangements included within the spirit and the scope of the appended claims.

What is claimed is:

1. An electrodeposition film forming method comprising:
   (a) a step of coating a first electrodeposition film on an inner surface of a through-hole which inner diameter is in a range from 50 microns to 150 microns, provided in a conductive substrate or a semiconductive substrate;
   (b) a step of removing a predetermined amount of the first electrodeposition film formed in a close proximity to an opening portion of the through-hole, prior to hardening the first electrodeposition film;
   (c) a step of hardening the first electrodeposition film after conducting the step (b) of removing the predetermined amount of the first electrodeposition film;
   (d) a step of coating a second electrodeposition film on a surface in close proximity to the opening portion of the through-hole; and
   (e) a step of hardening the second electrodeposition film.

2. An electrodeposition film forming method according to claim 1, wherein the first electrodeposition film is an electrodeposition film free from a fluidity adjusting agent, and the second electrodeposition film is an electrodeposition film containing a fluidity adjusting agent.

3. An electrodeposition film forming method according to claim 1, wherein the predetermined amount of the first electrodeposition film is selectively removed by an ultrasonic cleaning.

4. An electrodeposition film forming method according to claim 1, wherein each of the first electrodeposition film and the second electrodeposition film is an insulating film formed on the inner surface of the through-hole.

5. An electrodeposition film forming method according to claim 1, wherein a thickness of the electrodeposition film at the time of hardening is in a range from 2 microns to 20 microns.

6. A semiconductor apparatus in which conduction is established between a front surface and a rear surface, said apparatus comprising:
   a semiconductive substrate;
   a through-hole which inner diameter is in a range from 50 microns to 150 microns, penetrating the semiconductive substrate;
   an insulating film formed on an inner surface of the though-hole; and
   a conductive film formed on an inner surface of the insulating film, wherein the insulating film is composed of (i) a first electrodeposition film formed by hardening after removing a predetermined amount of the first electrodeposition film coated on a surface in close proximity to an opening portion of the though-hole prior to said hardening, and (ii) a second electrodeposition film coated on a surface in close proximity to the opening portion of the though-hole and thereafter hardened.

7. A semiconductor apparatus according to claim 6, wherein the first electrodeposition film is an electrodeposition film free from a fluidity adjusting agent, and the second electrodeposition film is an electrodeposition film containing a fluidity adjusting agent.

8. A semiconductor apparatus according to claim 6, wherein a thickness of the electrodeposition film at the time of hardening is in a range from 2 microns to 20 microns.

* * * * *

UNITED STATES PATENT AND TRADEMARK OFFICE
CERTIFICATE OF CORRECTION

| | | |
|---|---|---|
| PATENT NO. | : 7,052,991 B2 | Page 1 of 1 |
| APPLICATION NO. | : 11/014678 | |
| DATED | : May 30, 2006 | |
| INVENTOR(S) | : Masaki Mizuno | |

It is certified that error appears in the above-identified patent and that said Letters Patent is hereby corrected as shown below:

ON THE TITLE PAGE [30]:

Foreign Application Priority Data, "2003-089542" should read --2004-089542--.

COLUMN 12:

Line 37, "though-hole;" should read --through-hole;--;
    Line 43, "though-hole" should read --through-hole--; and
    Line 46, "though-hole" should read --through-hole--.

Signed and Sealed this

Fourteenth Day of November, 2006

JON W. DUDAS
*Director of the United States Patent and Trademark Office*